US006440804B1

United States Patent
Jen

(10) Patent No.: US 6,440,804 B1
(45) Date of Patent: Aug. 27, 2002

(54) STATIC RANDOM ACCESS MEMORY MANUFACTURING METHOD

(75) Inventor: Yi-Min Jen, Taipei Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/945,052

(22) Filed: Aug. 31, 2001

(30) Foreign Application Priority Data

Jul. 24, 2001 (TW) .................................. 090118008 A

(51) Int. Cl.⁷ .................. H01L 21/8244; H01L 21/336; H01L 21/425
(52) U.S. Cl. .................. 438/279; 438/238; 438/526
(58) Field of Search .................. 438/526, 581, 438/592, 683, 238, 210, 385, 382, 299

(56) References Cited

U.S. PATENT DOCUMENTS

| | | | | |
|---|---|---|---|---|
| 4,445,266 A | * | 5/1984 | Mai et al. | 438/238 |
| 5,372,956 A | * | 12/1994 | Baldi | 438/233 |
| 5,391,905 A | * | 2/1995 | Yamazaki | 257/344 |
| 5,926,706 A | * | 7/1999 | Liaw et al. | 438/238 |
| 6,008,082 A | * | 12/1999 | Rolfson et al. | 438/238 |
| 6,022,794 A | * | 2/2000 | Hsu | 438/526 |
| 6,150,267 A | * | 11/2000 | Chen | 438/683 |
| 6,165,831 A | * | 12/2000 | Hsu | 438/210 |

\* cited by examiner

*Primary Examiner*—John F. Niebling
*Assistant Examiner*—Walter L. Lindsay, Jr.
(74) *Attorney, Agent, or Firm*—Wu & Cheung, LLP; Charles C.H. Wu

(57) ABSTRACT

A static random access memory manufacturing method. A substrate having a gate oxide layer and a first conducting layer is defined to form a buried contact window opening. A second conducting layer is formed upon the substrate with a recess structure at the region of the buried contact opening. A buried contact window is formed in the substrate under the buried contact window opening. A protective layer is formed upon the substrate and fills the recess. A portion of the protective layer is removed, and a patterned photoresist layer is formed upon the substrate. Using the photoresist as a mask, the first and second conducting layer are etched to form a gate electrode and an interconnect. The patterned photoresist layer is removed. The protective layer can be removed or retained. An implantation procedure is performed, thereby forming a source/drain, thereby connecting the source/drain and the contact window.

20 Claims, 6 Drawing Sheets

STATIC RANDOM ACCESS MEMORY MANUFACTURING METHOD

CROSS-REFERENCE TO RELATED APPLICATION

This application claims the priority benefit of Taiwan application serial no. 90118008, filed on Jul. 24, 2001.

BACKGROUND OF THE INVENTION

1. Field of the Invention

The present invention relates to a random access memory (RAM) manufacturing method. More particularly, the present invention relates to a static random access memory (SRAM) manufacturing method.

2. Description of the Related Art

RAM is a volatile memory, wherein SRAM uses the conducting conditions of a memory cell internal chip to store material. SRAM is specially characterized by high speed operation, low power consumption and simple operation. Thus, SRAM is advantageous since the design is simple and it does not need to often renew the data for access. Generally, within the SRAM, the contact windows connecting the gate electrode and the interconnect is usually a buried contact window.

FIGS. 1A to 1D are diagrams in cross-sectional view of a conventional SRAM manufacturing method.

Referring to FIG. 1A, a substrate with a pre-formed gate oxide layer 102 and a first polysilicon layer 104 is defined. A buried contact window opening 106 is formed and exposes the substrate 100.

Referring to FIG. 1B, a second polysilicon layer 108 is formed upon the substrate 100 and covers the buried contact window opening 106. An implantation procedure 110 is performed and forms a buried contact window 112.

Referring to FIG. 1C, a photoresist layer 114 is formed upon the substrate 100. The photoresist layer 114 is patterned. In this manner, the thickness of the polysilicon layer at the regions 120 and 122 can be observed.

Referring to FIG. 1D, using the patterned photoresist layer 114 as a mask, etching is performed on the first and second polysilicon layers 104 and 108, thereby forming a gate electrode 116 and an interconnect 118.

However, in the above-described process of the related art, during the etching procedure of the gate electrode 116 and the interconnect 118, as seen in FIG. 1C, there is a difference in thickness between the polysilicon layer in the region 120 and the region 122. Thus, after the entire removal of the first polysilicon layer 108 in the region 120, at least a portion of the second polysilicon layer 104 in region 122 has still not been etched away. Thus, when continuously etching away the second polysilicon layer 104, a trench 124 such as the one shown in FIG. 1D is formed. When the depth of the trench 124 in the substrate 100 exceeds the depth of the buried contact window 112, the buried contact window 112 is broken. An open circuit occurs between the successively formed device source/drain and the buried contact window 112.

SUMMARY OF THE INVENTION

The invention provides a SRAM manufacturing method. An occurrence of a silicon trench is prevented and an open circuit between the device source/drain and the buried contact window beneath the buried window is prevented.

As embodied and broadly described herein, the invention provides a SRAM manufacturing method. A substrate with a pre-formed gate oxide layer and a first conducting layer is defined, thereby forming a buried contact window opening and exposing the substrate. A second conducting layer is formed upon the substrate and covers the buried contact window opening. An implantation procedure is performed on the second conducting layer. A thermal annealing process is performed, causing the dopant within the second conducting layer to disperse into the substrate, thereby forming a buried contact window within the substrate. Using a spin coating technique, an oxide layer is formed on the substrate and the contact window is filled in. A portion of the oxide layer is removed, causing the top of the oxide layer to be level with the top of conducting layer. Using the second conducting layer as an etch stop layer, an etching back process is performed on the oxide layer. A photoresist layer is formed upon the substrate and the photoresist layer is patterned thereafter. Using the photoresist layer as a mask, the exposed second conducting layer is removed. By continuously etching away the first conducting layer beneath the second conducting layer, a gate electrode and an interconnect are formed. The patterned photoresist layer is removed. The oxide layer can be either removed or retained. A second implantation layer is performed to form a source/drain of the gate electrode, causing the source/drain and the buried contact window to connect to each other.

The advantage of the present invention is that a local planarization protective layer is formed using such a technique as spin coating. Since there are numerous etching options for the protective layer and the etched polysilicon layer, the protective layer is not easily removed and can be used as a mask. The successively formed device source/drain are specially characterized by self-alignment. During etching of the gate electrode, over-etching of the substrate due to different thicknesses of the etched layers is prevented, trench formations do no occur and open circuit between the device source/drain and the buried contact window is prevented.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention, and, together with the description, serve to explain the principles of the invention. In the drawings.

DESCRIPTION OF THE PREFERRED EMBODIMENTS

FIGS. 2A to 2F are flow diagrams in cross-sectional view of a SRAM manufacturing method according to a first preferred embodiment of the invention .

Figure 2A:
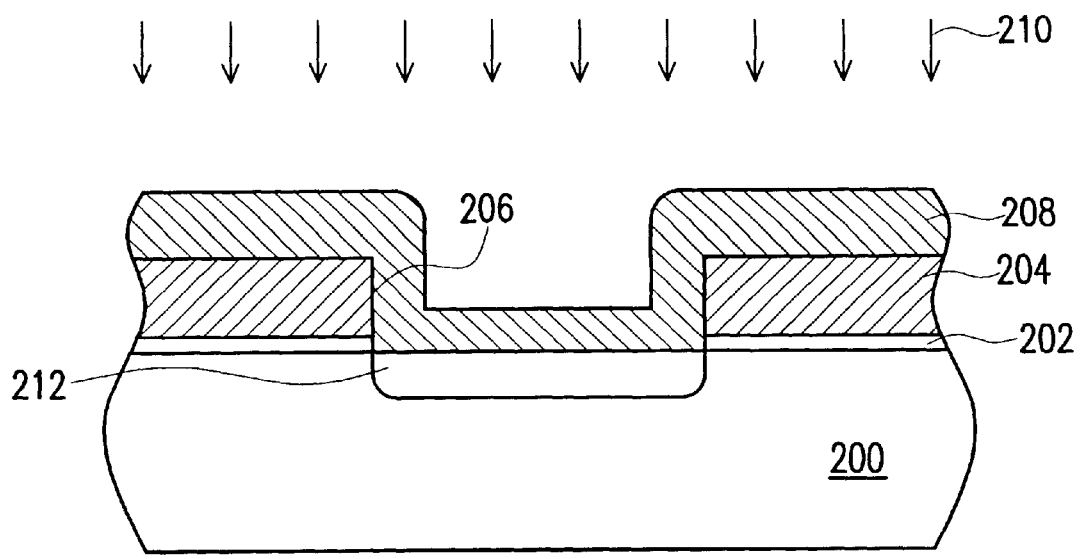
FIGS. 2A to 2F are flow diagrams in cross-sectional view of a SRAM manufacturing method according to a first preferred embodiment of the invention.

Referring to FIG. 2A, a gate oxide layer 202 and a first conducting layer 204 are successively formed upon a substrate 200. The conducting layer 204 and The gate oxide layer 202 are defined, thereby forming a buried contact window opening 206 and exposing the substrate 200. The first conducting layer 204 includes a material such as polysilicon. A second conducting layer 208 is formed upon the substrate 200 and covers the buried contact window opening 206. A recess is formed conformal to the buried contact window opening 206. The second conducting layer is made of a material such as polysilicon. A buried contact window 212 is formed within the substrate 200 at a portion corresponding to the contact window opening 206. The formation of the buried contact window is formed by, for example, an implanting process 210 to dope the second conducting layer 208, causing the second conducting layer to have dopants. A thermal annealing process is performed, causing the dopants within the second conducting layer 208 to disperse into the substrate 200, thereby forming the buried contact window 212.

Figure 2B:
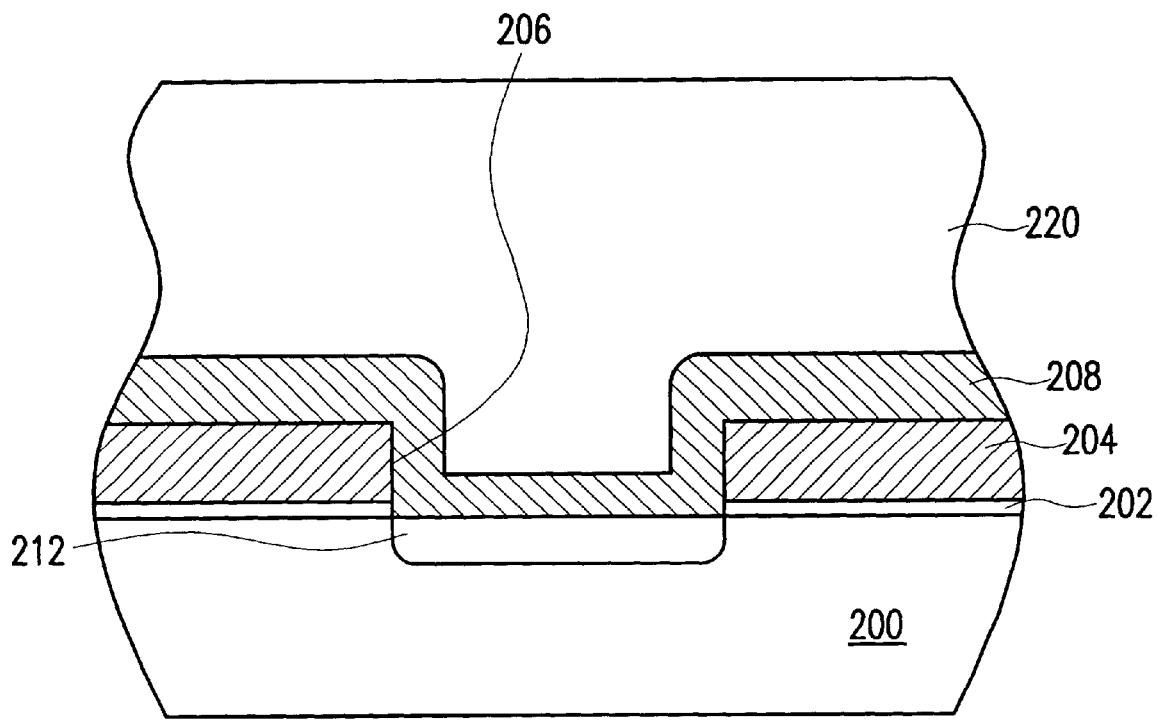

Referring to FIG. 2B, a protective layer 220 is formed upon the substrate 200. The recess formed in the second conducting layer 208 is filled by a process such as spin coating. The protective layer 220 is made of a material such as spin-on glass (SOG) or fluorinated oxide (FOX). After the formation of the protective layer 220, a curing procedure can be included.

Figure 2C:
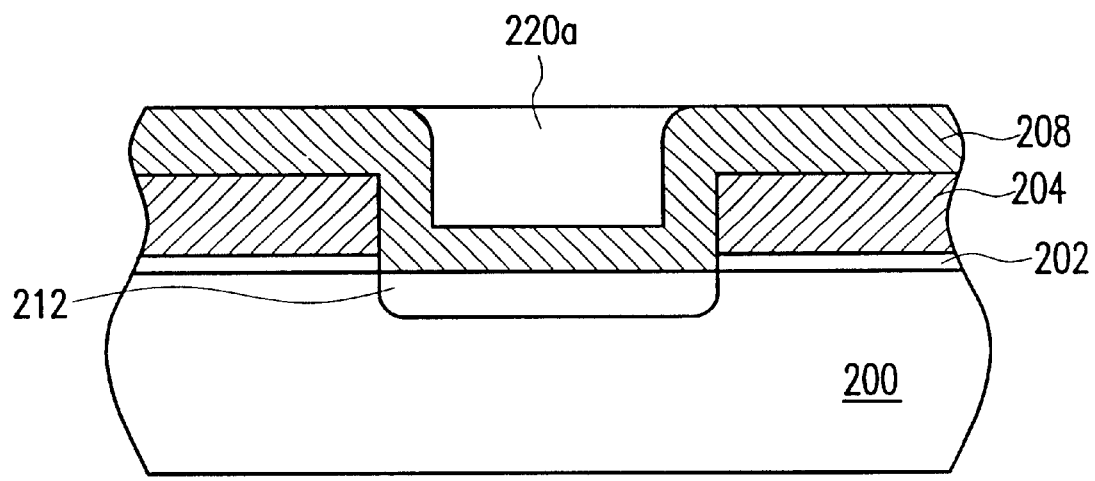

Referring to FIG. 2C, a portion of the protective layer 220 is removed. The removal process can use the second conducting layer 208 as an etch stop layer and perform etchback on the protective layer 220. The removal process can also use the second conducting layer 220 as the polish stop layer and perform a chemical mechanical polishing process.

Figure 2D:
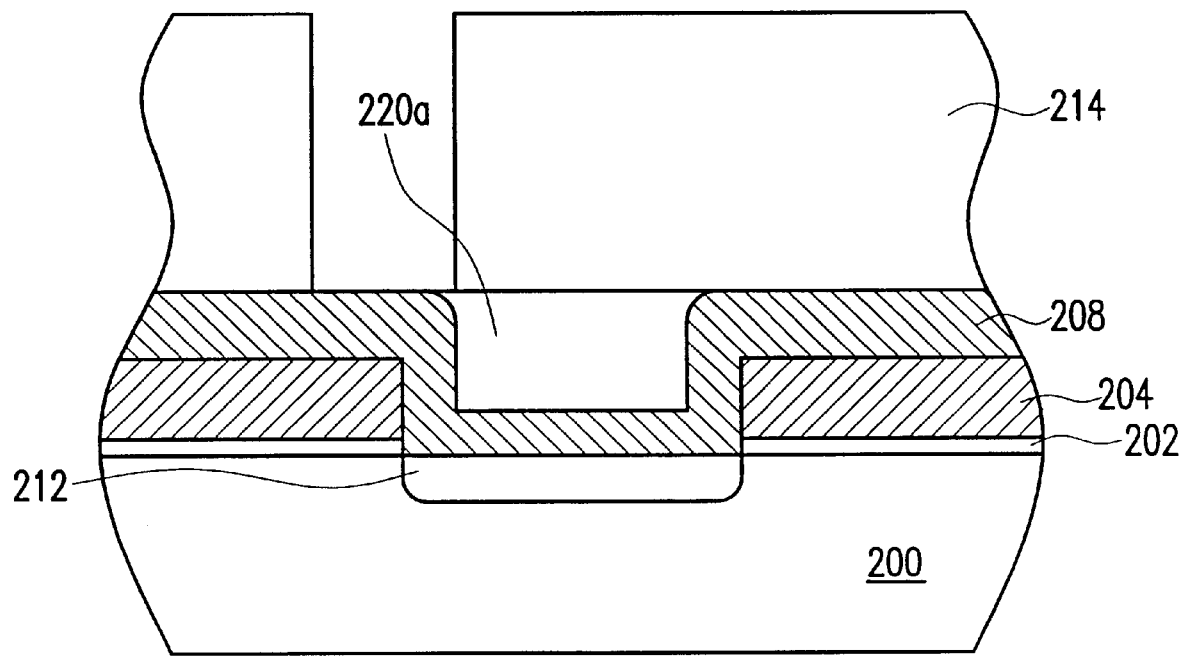

Referring to FIG. 2D, a photoresist layer 214 is formed upon the substrate 200. The photoresist layer 214 is patterned, thereby exposing a portion of the protective layer 220a and the second conducting layer 208.

Figure 2E:
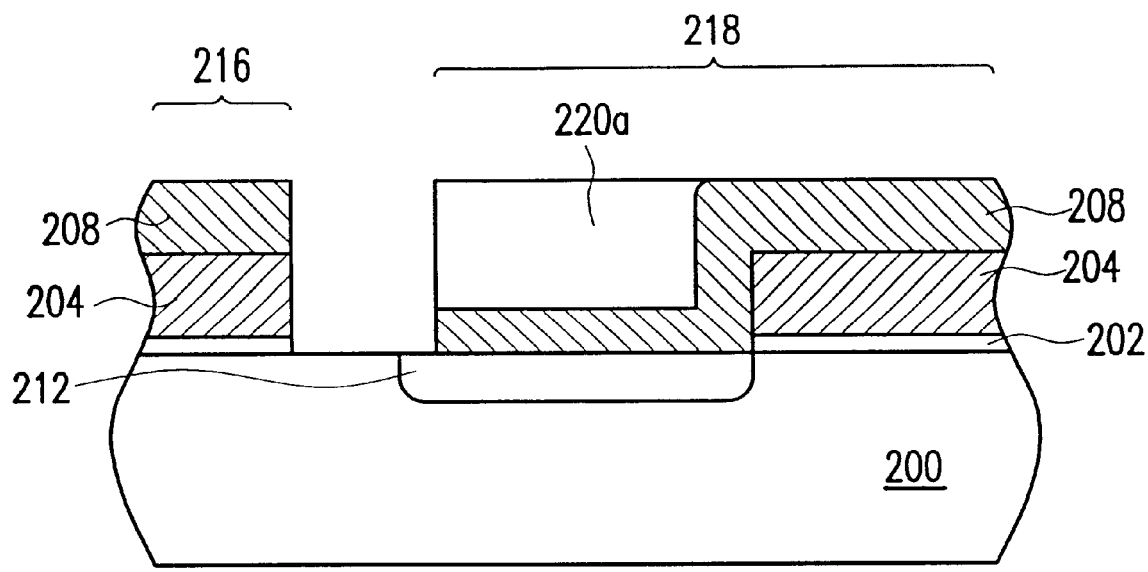

Referring to FIG. 2E, using the patterned photoresist layer 214 as a mask, the exposed second conducting layer 208 is removed. By continuously etching away the first conducting layer 204 beneath the second conducting layer 208, a gate electrode 216 and an interconnect 218. The photoresist layer 214 is removed. Since the etching selectivity between the protective layer 220a and the etched conductive layers 204 and 208 is large, the protective layer 220a is not removed and serves as a mask. This allows the subsequent formation of source/drain region of device has the characteristics of self-aligned. In other words, in actuality, the thickness difference at the places to be etched has no effect. After entirely removing the exposed second conducting layer 208, the break of the buried contact window leading to an open circuit does not occur between the successively formed device source/drain and the buried contact window as in the related art.

Figure 2F:
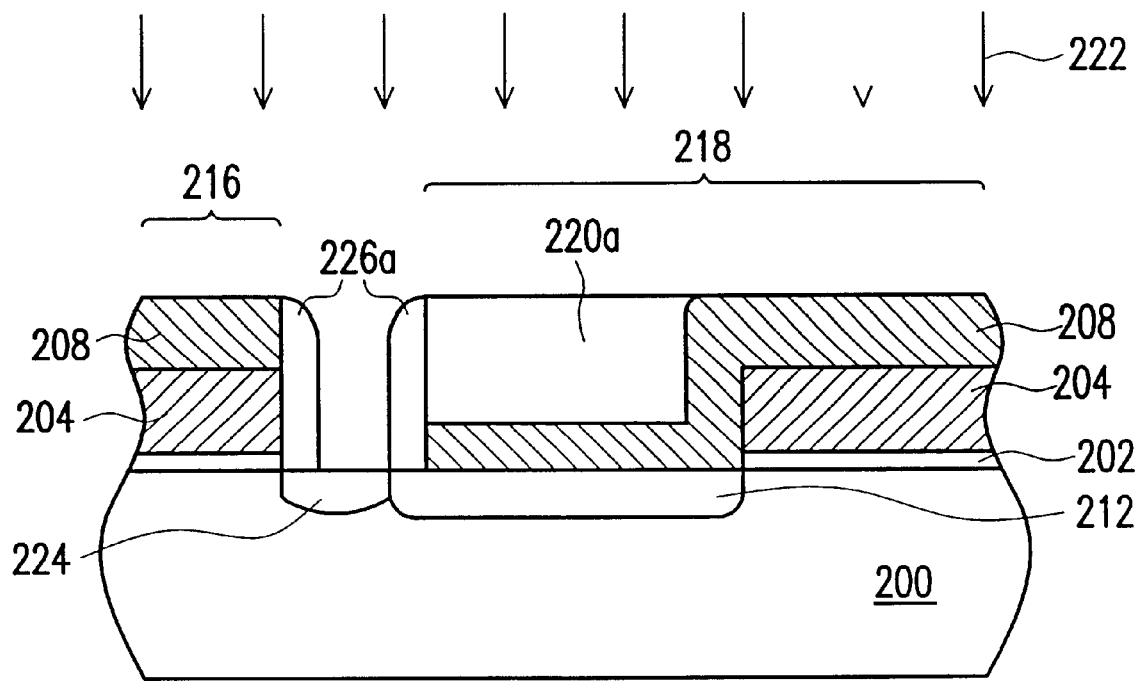

The protective layer 220a can also be retained for use as an interlevel dielectric layer. Referring to FIG. 2F, a second implantation procedure 222 is performed in order to form a source/drain 224, causing the source/drain 224 and the buried contact window 212 to be connected. A spacer 226a is formed between the sidewalls of gate electrode 216 and the interconnect 218.

Figure 2G:
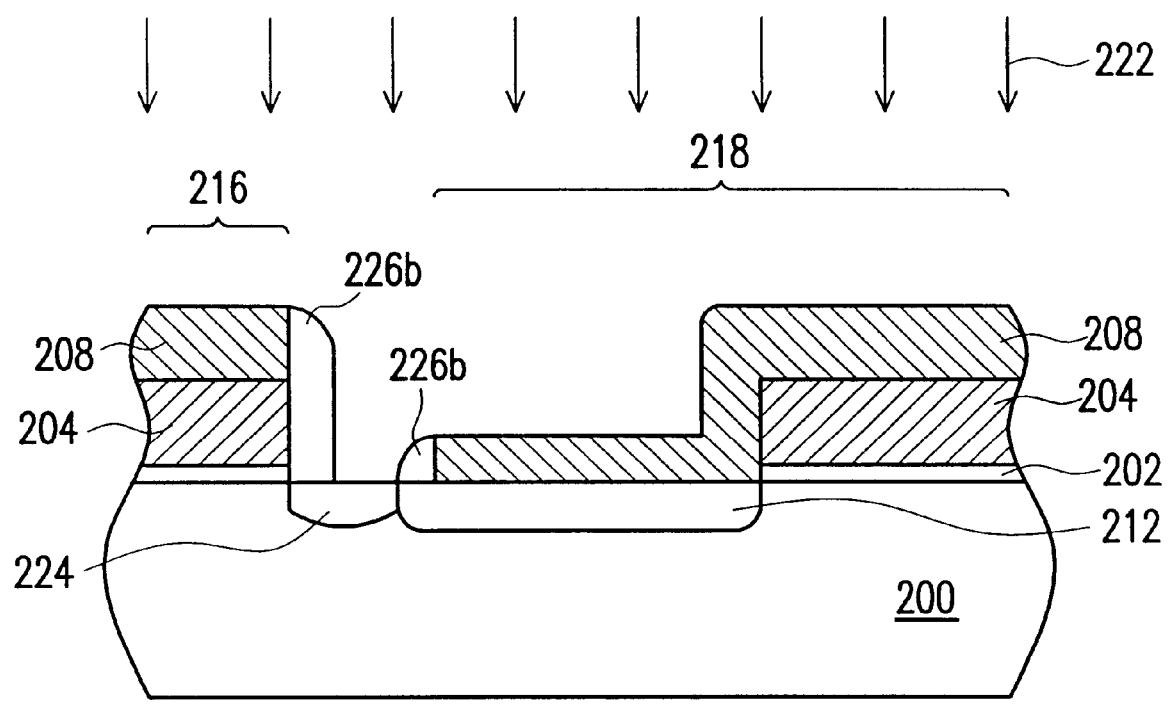
FIG. 2G is a flow diagram in cross-sectional view of a SRAM manufacturing method according to a second preferred embodiment of the invention.

After the manufacturing process as shown in FIG. 2E, referring to FIG. 2G, the protective layer 220a is removed. A second implantation procedure 222 is performed in order to form a source/drain 224, thereby connecting the source/drain 224 and the buried contact window 212. A spacer 226b is formed between the sidewalls of the gate electrode 216 and interconnect 218.

Figure 1A:
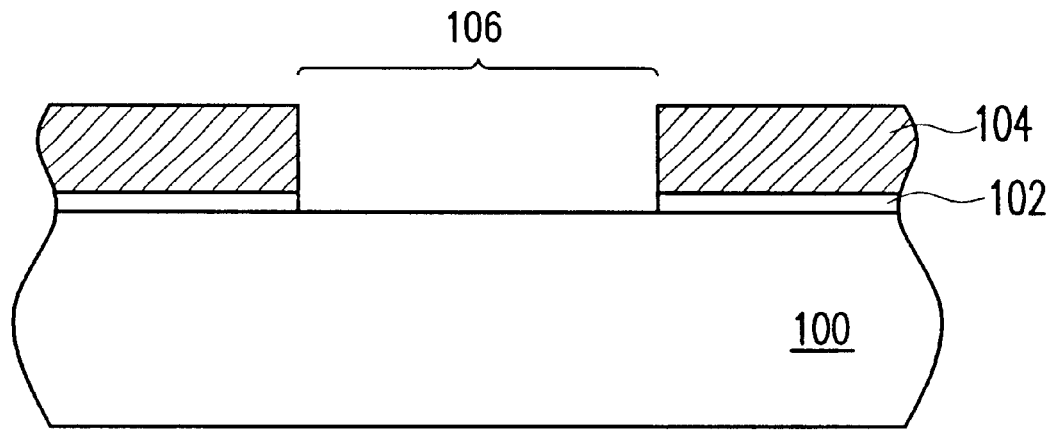
FIGS. 1A to 1D are flow diagrams in cross-sectional view of a conventional SRAM manufacturing method.
Figure 1B:
Figure 1B:
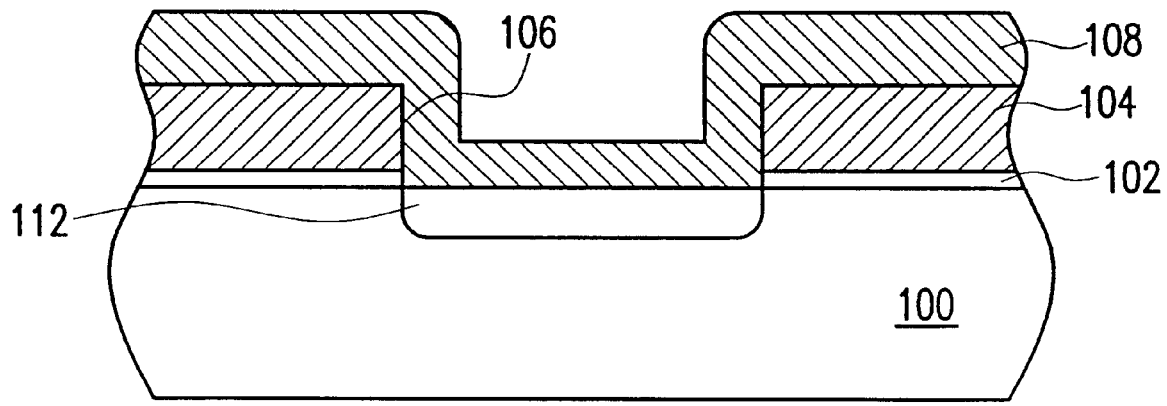
Figure 1C:
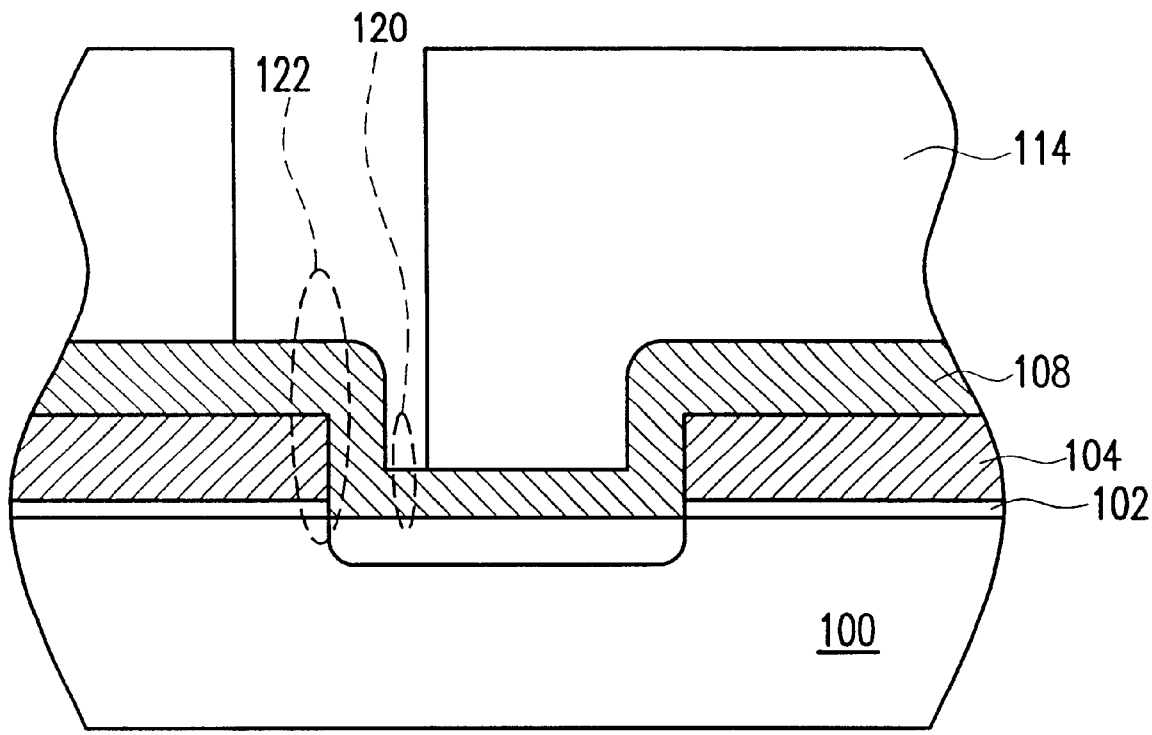
Figure 1D:
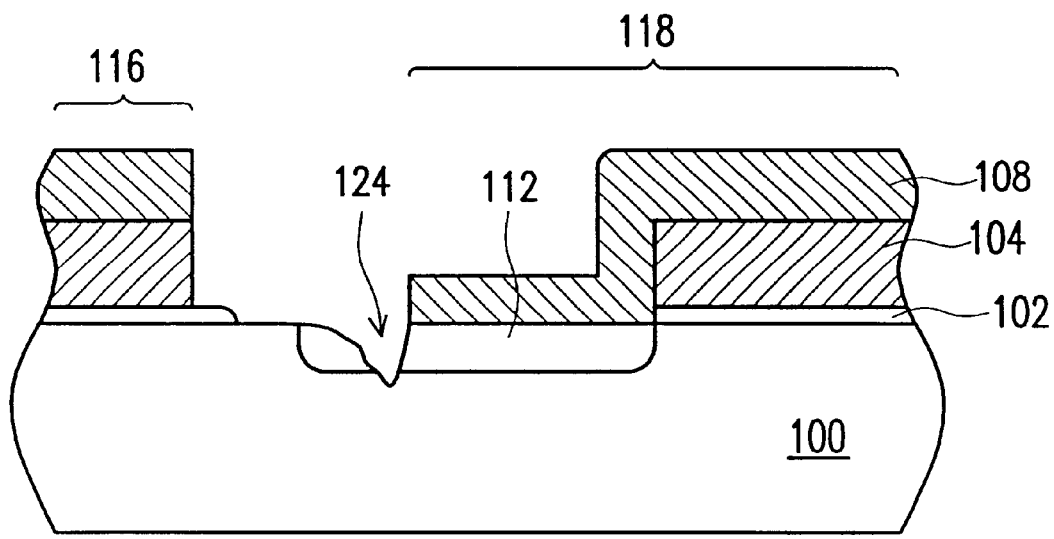

The special characteristic of the present invention is that after the formation of the buried contact window during the process of manufacturing a buried contact window. Using a technique such as spin coating, a protective layer is formed upon the substrate. Since the spin coating protective layer has the advantage of local planarization, a protective layer is used as a relatively thin polysilicon conducting layer (such as region 120 as shown in FIG. 1C). During etching of the gate electrode, overetching and trench formation due to uneven thickness of the etched layers are prevented. Open circuit of the device source/drain and the buried contact window is also prevented.

Also, another special characteristic of the present invention is that since there are several etching options for the locally planarized protective layer and the removed conducting layer, the protective layer is not easily removed and is used as a mask, causing the successively formed device source/drain to have the special characteristic of self-alignment.

Moreover, in the present invention, the special characteristic of using spin coating technique to form a protective layer for use as protection can also be applied to other semiconductor devices that form a buried contact window during manufacturing. Thus, open circuit caused because of a silicon trench buried contact window is prevented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A static random access memory (SRAM) manufacturing method, comprising:

providing a substrate;

successively forming a gate oxide and a first conducting layer upon the substrate;

defining the first conducting layer and the gate oxide layer, thereby forming a buried contact window opening and the buried contact window opening exposing the substrate;

forming a second conducting layer upon the substrate and covering the buried contact window opening, causing the second conducting layer to have a recess on the buried contact window opening;

forming a buried contact window within the substrate corresponding to the buried contact window;

forming a protective layer in the recess;

forming a patterned photoresist layer over the substrate, wherein the patterned photoresist layer has an opening;

etching a portion of the second conducting layer exposed by the opening, using the patterned photoresist layer and the protective layer as a mask layer, and continuously etching the first conductive layer to form a gate electrode and an interconnect;

removing the patterned photoresist; and performing an implantation process, whereby a source/drain region is formed in the substrate.

2. The SRAM manufacturing method as defined in claim 1, wherein the step of forming the protective layer in the recess comprises:

forming the protective layer over the substrate, thereby filling the recess; and removing a portion of the protective layer outside the recess.

3. The SRAM manufacturing method as defined in claim 2, wherein the step of forming the protective layer includes a process spin coating.

4. The SRAM manufacturing method as defined in claim 2, wherein the step of removing a portion of the protective layer outside the recess includes an etching back process.

5. The SRAM manufacturing method as defined in claim 2, wherein the step of removing a portion of the protective layer outside the recess includes a process of chemical mechanical polishing.

6. The SRAM manufacturing method as defined in claim 2, wherein after the step of forming the protective layer over the substrate, the method further comprises a curing procedure.

7. The SRAM manufacturing method as defined in claim 1, wherein the step of forming the buried contact window within the substrate exposed by the buried contact window comprises:

performing a second implantation procedure on the second conducting layer, whereby the second conducting layer is doped with dopants; and performing a thermal annealing process, causing the dopants in the second conducting layer to disperse into the substrate, thereby forming the buried contact window.

8. The SRAM manufacturing method as defined in claim 1, comprising removing the protective layer after the step of etching the portion of the second conducting layer exposed by the opening.

9. The SRAM manufacturing method as defined in claim 1, wherein after the step of performing an implantation process, the method further comprises forming a spacer on a sidewall of the gate electrode and the interconnect.

10. The SRAM manufacturing method as defined in claim 1, wherein the protective layer includes one selected from the group consisting of spin-on glass (SOG) and a fluorinated oxide (FOX).

11. The SRAM manufacturing method as defined in claim 1, wherein the first and second conducting layers include polysilicon.

12. A local interconnect manufacturing method, comprising:

providing a substrate;

successively forming a gate oxide layer and a first conducting layer upon the substrate;

defining the first conducting layer and the gate oxide layer to form a buried contact window opening and the buried contact window opening exposing a portion of the substrate;

forming a second conducting layer upon the substrate and covering the buried contact window opening, wherein the second conducting layer has a recess at a region of the buried contact window opening;

forming a doped region in the substrate corresponding to the buried contact window opening;

forming a protective layer in the recess;

forming patterned photoresist layer upon the substrate, wherein the patterned photoresist layer has an opening and the opening exposes a portion of the second conducting layer; and using the patterned photoresist layer and the protective layer as a mask, etching a portion of the second conducting layer exposed by the opening, and continuously etching the first conducting layer beneath the second conducting layer, whereby the second and first conducting layer has a pattern structure.

13. The local interconnect manufacturing method as defined in claim 12, wherein the step of forming the protective layer in the recess comprises:

forming the protective layer upon the substrate, thereby filling the recess; and removing a portion of the protective layer outside the recess.

14. The local interconnect manufacturing method as defined in claim 13, wherein to the step of forming the protective layer comprises spin coating.

15. The local interconnect manufacturing method as defined in claim 13, wherein after the step of forming the protective layer, the method comprises a curing process.

16. The local interconnect manufacturing method as defined in claim 13, wherein the step of removing a portion of the protective layer outside the recess comprises an etching back process.

17. The local interconnect manufacturing method as defined in claim 13, wherein the step of removing a portion of the protective layer outside the recess comprises a chemical mechanical polishing process.

18. The local interconnect manufacturing method as defined in claim 12, wherein the step of forming the doped region comprises:

performing an implantation procedure on the second conducting layer, thereby causing the second conducting layer to have a dopant; and performing a thermal annealing process, causing the dopant within the second conducting layer to disperse into the substrate, thereby forming the buried contact window.

19. The local interconnect manufacturing method as defined in claim 12, wherein the protective layer includes one selected from the group consisting of SOG and FOX.

20. The local interconnect manufacturing method as defined in claim 12, wherein the first and second conducting layers includes polysilicon.

* * * * *